United States Patent
Sakaguchi et al.

(10) Patent No.: US 7,154,207 B2
(45) Date of Patent: Dec. 26, 2006

(54) SURFACE ACOUSTIC WAVE DEVICE AND METHOD FOR MANUFACTURING THE SAME

(75) Inventors: Kenji Sakaguchi, Komatsu (JP); Kenji Akiyama, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 155 days.

(21) Appl. No.: 10/922,032

(22) Filed: Aug. 19, 2004

(65) Prior Publication Data

US 2005/0046307 A1    Mar. 3, 2005

(30) Foreign Application Priority Data

Sep. 2, 2003 (JP) .............................. 2003-310342
Jul. 15, 2004 (JP) .............................. 2004-209035

(51) Int. Cl.
*H03H 9/25* (2006.01)

(52) U.S. Cl. .............................. 310/313 R; 310/313 B

(58) Field of Classification Search ................ 310/313, 310/363–366
See application file for complete search history.

(56) References Cited

U.S. PATENT DOCUMENTS

| 4,625,184 A | * | 11/1986 | Niitsuma et al. ........... 333/150 |
| 5,252,882 A | * | 10/1993 | Yatsuda .................... 310/313 R |
| 5,471,722 A | * | 12/1995 | Yatsuda ..................... 29/25.35 |
| 6,121,859 A | * | 9/2000 | Takahashi .................... 333/193 |
| 6,720,845 B1 | * | 4/2004 | Takahashi et al. ........... 333/193 |
| 6,750,592 B1 | * | 6/2004 | Takahashi et al. ........ 313/313 D |
| 6,930,435 B1 | * | 8/2005 | Boecking .................... 310/317 |
| 2002/0121841 A1 | | 9/2002 | Shimoe et al. |
| 2003/0160541 A1 | | 8/2003 | Ikeda et al. |
| 2004/0207485 A1 | * | 10/2004 | Kawachi et al. ............. 333/133 |
| 2005/0242961 A1 | * | 11/2005 | Shibata et al. ........... 340/572.7 |
| 2006/0043823 A1 | * | 3/2006 | Obara et al. ............. 310/313 R |

FOREIGN PATENT DOCUMENTS

| JP | 02-072655 | 3/1990 |
| JP | 02-106983 | 4/1990 |
| JP | 08-330592 | 12/1996 |
| JP | 2001-217672 | 8/2001 |
| JP | 2002-261560 | 9/2002 |
| JP | 2003-174056 | 6/2003 |

OTHER PUBLICATIONS

Official Communication issued in the corresponding European Application No. 04292103.1; dated Jul. 21, 2005.

* cited by examiner

*Primary Examiner*—Tom Dougherty
*Assistant Examiner*—J. Aguirrechea
(74) *Attorney, Agent, or Firm*—Keating & Bennett, LLP

(57) ABSTRACT

A surface acoustic wave device includes a piezoelectric substrate, an interdigital transducer (IDT) electrode, and a connecting portion that is electrically connected with the IDT electrode. The surface acoustic wave device further includes a wiring portion, a portion of which is disposed on the connecting portion, and a bump disposed on the wiring portion. The connecting portion includes a comb-shaped portion at an end of the connecting portion on which the wiring portion is disposed.

22 Claims, 3 Drawing Sheets

SURFACE ACOUSTIC WAVE DEVICE AND METHOD FOR MANUFACTURING THE SAME

BACKGROUND OF THE INVENTION

1. Field of the Invention

The present invention relates to a surface acoustic wave device including at least one interdigital transducer (IDT) electrode formed by a lift-off method and at least one connecting portion that is electrically connected with the IDT electrode, and in particular, to a surface acoustic wave device further including at least one wiring portion disposed on the connecting portion and a method for manufacturing the same.

2. Description of the Related Art

In recent years, surface acoustic wave devices assembled by a flip-chip bonding system have been widely used in order to reduce the size of surface acoustic wave devices. In this flip-chip bonding system, at least one bump is disposed on at least one pad area in a surface acoustic wave device. The surface acoustic wave device is bonded with at least one connecting area disposed on, for example, a package through the bump. Thus, the surface acoustic wave device is electrically connected and mechanically bonded with the package.

The bump used in the flip-chip bonding system provides not only electrical connection of the surface acoustic wave device to the package but also mechanical fixing of the surface acoustic wave device to the package. Therefore, sufficient bonding strength is required between the bump and the pad area in the surface acoustic wave device. In general, in order to increase the bonding strength between the bump and the pad area, the film thickness of the pad area is increased.

In the surface acoustic wave device, an IDT electrode disposed on a piezoelectric substrate and a connecting portion electrically connected with the IDT electrode are formed at the same time by a lift-off method. Therefore, the connecting portion has the same film thickness as that of the IDT electrode portion. In order to form a bump having sufficient bonding strength, another layer having a predetermined pattern is formed on the connecting portion.

When the IDT electrode, having a fine pattern, is formed by the lift-off method, a resist pattern for forming the IDT electrode is formed such that the cross-section of opening areas corresponding to the fine pattern tapers from the substrate surface to the upper surface of the resist.

Also, the resist pattern of the connecting portion, which is rougher than the IDT electrode, is formed such that the cross-section of opening areas tapers from the substrate surface to the upper surface of the resist. However, as a result of subsequent heat treatment such as baking, the above-described taper, i.e., a reverse-tapered shape, cannot be maintained in the connecting portion having the rough pattern. Consequently, after the resist pattern and unnecessary electrode films are removed by the lift-off method, for example, burring of an electrode occurs at an end of the connecting portion.

Furthermore, another layer having a predetermined pattern is formed on the connecting portion in order to form the bump. Unfortunately, for example, the above-described electrode burring causes a problem such as disconnection on the other layer.

In order to solve the above-described problem, Japanese Unexamined Patent Application Publication No. 2002-261560 discloses the following surface acoustic wave device. The above-described patent document discloses a surface acoustic wave device and a method for manufacturing the same including the steps of forming a connecting portion of a surface acoustic wave element, and subsequently performing etching such that an end surface of the connecting portion has a stair-like shape.

However, the surface acoustic wave device and the method for manufacturing the same according to the above-described related art have the following problem.

According to the above-described patent document, a connecting portion of a surface acoustic wave element is formed, and etching is then performed such that an end surface of the connecting portion has a stair-like shape. In this process, a resist pattern in which the end of the connecting portion corresponds to an opening area is formed on the surface acoustic wave element having the connecting portion thereon. Subsequently, a portion of the end surface of the connecting portion is removed by, for example, submerging the element in an etchant. The resist pattern is then removed to form the desired pattern. The formation of this resist pattern includes the following steps. A resist having a predetermined film thickness is applied, the resist layer is exposed with a photo-mask having a predetermined pattern, and the resultant resist layer is then developed. Unfortunately, this method includes many steps.

SUMMARY OF THE INVENTION

In order to overcome the problems described above, a surface acoustic wave device according to a preferred embodiment of the present invention includes a piezoelectric substrate, an interdigital transducer (IDT) electrode formed on the piezoelectric substrate by a lift-off method, a connecting portion electrically connected with the IDT electrode, and a wiring portion disposed on the connecting portion, wherein the IDT electrode and the connecting portion are formed at the same time, and a comb-shaped portion is provided at an end of the connecting portion on which the wiring portion is disposed.

The space between combs of the comb-shaped portion is preferably about 5 μm or less. The space between combs of the comb-shaped portion is preferably substantially the same as the spacing width of the IDT electrode.

A surface acoustic wave device according to another preferred embodiment of the present invention includes a piezoelectric substrate, an IDT electrode formed on the piezoelectric substrate by a lift-off method, a connecting portion electrically connected with the IDT electrode, and a wiring portion disposed on the connecting portion, wherein the IDT electrode and the connecting portion are formed at the same time, and a fine irregular-shaped portion having an irregularity of about 5 μm or less is provided at an end of the connecting portion on which the wiring portion is disposed.

The IDT electrode and the connecting portion preferably have a thickness of at least about 200 nm.

A method for manufacturing a surface acoustic wave device according to another preferred embodiment of the present invention includes the steps of preparing a piezoelectric substrate, forming an IDT electrode and a connecting portion that is electrically connected with the IDT electrode on the piezoelectric substrate by a lift-off method, and forming a wiring portion on the connecting portion, wherein the step of forming the connecting portion includes a step of forming a comb-shaped portion at an end of the connecting portion on which the wiring portion is formed.

A method for manufacturing a surface acoustic wave device according to another preferred embodiment of the present invention includes the steps of preparing a piezoelectric substrate, forming an IDT electrode and a connecting portion that is electrically connected with the IDT electrode on the piezoelectric substrate by a lift-off method, and forming a wiring portion on the connecting portion, wherein the step of forming the connecting portion includes a step of forming a fine irregular-shaped portion having an irregularity of about 5 μm or less at an end of the connecting portion on which the wiring portion is formed.

In the surface acoustic wave device according to preferred embodiments of the present invention and the method for manufacturing the same, a connecting portion that does not have electrode burring at an end thereof is provided in the surface acoustic wave device.

Therefore, problems such as disconnection on, for example, a wiring portion disposed on the connecting portion does not occur. Consequently, the present invention provides a surface acoustic wave device having greatly improved reliability.

These and various other features, elements, steps, characteristics and advantages of the present invention will become more apparent from the following detailed description of preferred embodiments thereof with reference to the attached drawings.

DETAILED DESCRIPTION OF PREFERRED EMBODIMENTS

First Preferred Embodiment

A first preferred embodiment of the present invention will now be described in detail with reference to the attached drawings.

Figure 1:
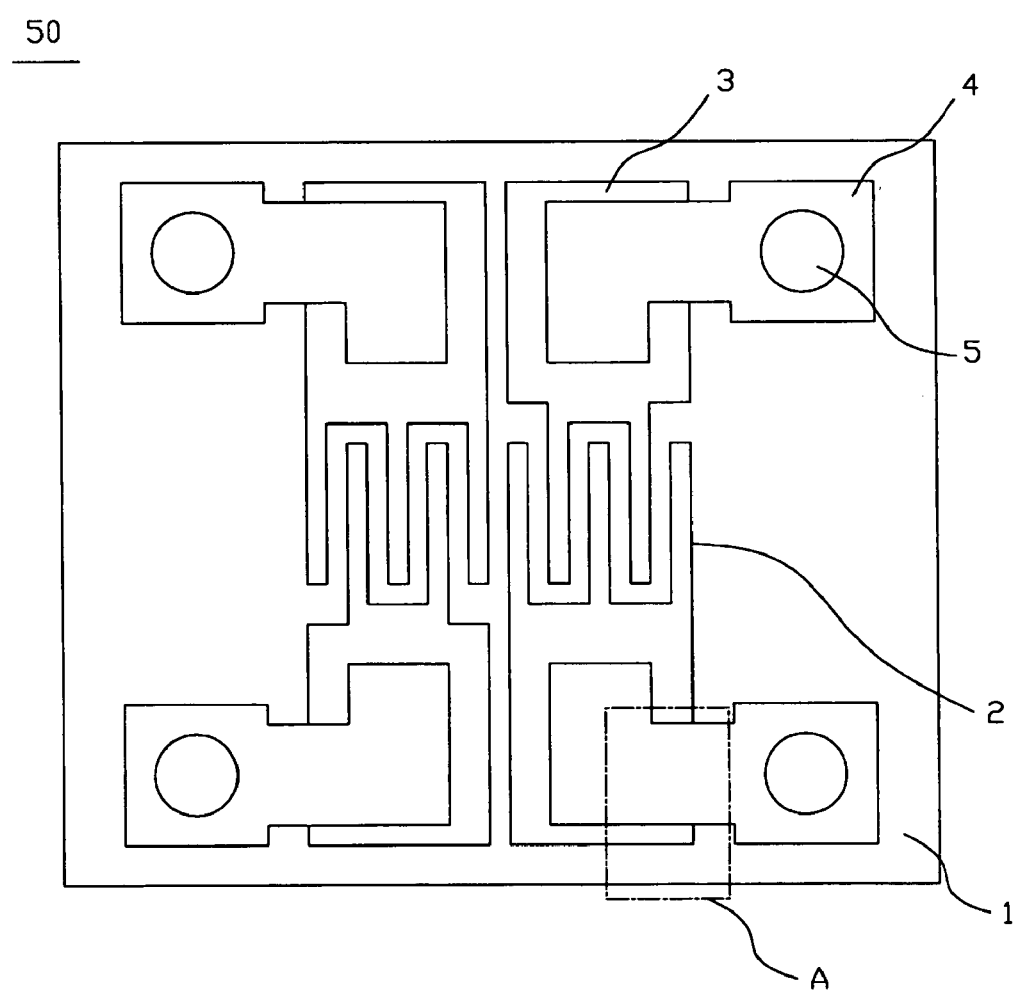
FIG. 1 is a schematic plan view of a surface acoustic wave device according to a preferred embodiment of the present invention (first preferred embodiment)
Figure 2:
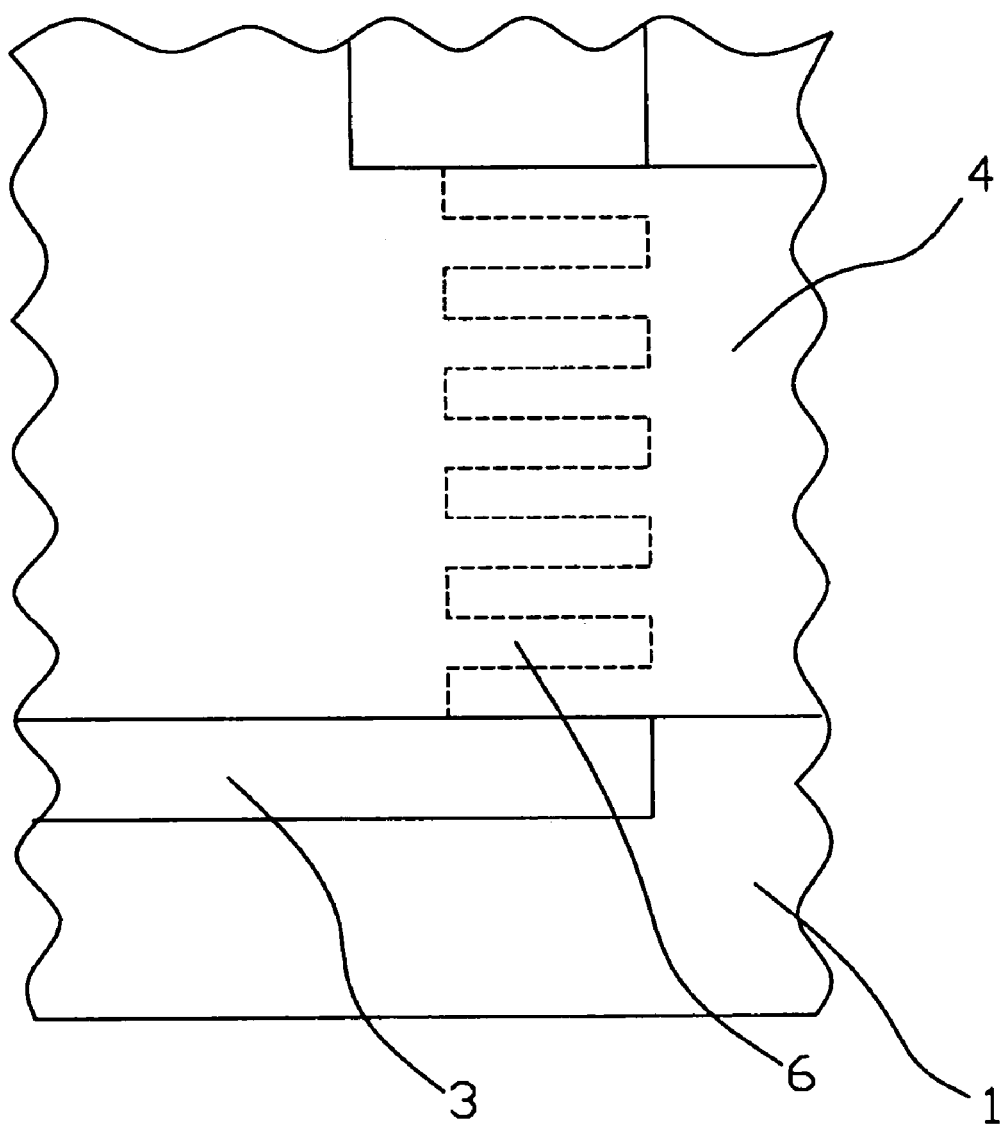
FIG. 2 is a partial enlarged plan view showing the example of the surface acoustic wave device according to the preferred embodiment of the present invention (Example 1)

FIG. 1 is a schematic plan view of a surface acoustic wave device according to a first preferred embodiment of the present invention, and FIG. 2 is a schematic enlarged plan view showing portion A in FIG. 1.

Referring to FIG. 1, a surface acoustic wave device 50 includes a piezoelectric substrate 1, interdigital transducer (IDT) electrodes 2, and connecting portions 3 that are electrically connected with the IDT electrodes 2. The surface acoustic wave device 50 further includes wiring portions 4, a portion of which is disposed on the connecting portions 3, and bumps 5 disposed on the wiring portions 4.

In FIG. 2, a portion that is not the top layer is shown by a broken line.

As shown in FIG. 2, a connecting portion 3 is disposed on the piezoelectric substrate 1. A wiring portion 4 is disposed on a portion of the connecting portion 3. The connecting portion 3 includes a comb-shaped portion 6 at an end of the connecting portion 3 on which the wiring portion 4 is disposed.

A method for manufacturing the above surface acoustic wave device 50 according to the first preferred embodiment of the present invention will now be described in detail.

First, a resist having a desired thickness is applied on the piezoelectric substrate 1 such as a $LiTaO_3$ substrate with, for example, a spin coater. The piezoelectric substrate 1 is not limited to the $LiTaO_3$ substrate. Other substrates such as quartz crystal, $LiNbO_3$, and $Li_2B_4O_7$ substrates may be used according to the desired piezoelectricity.

Subsequently, the resist is exposed with a mask for photolithography having a predetermined pattern corresponding to the IDT electrodes 2, the connecting portions 3, and the comb-shaped portions 6. The resist is then developed to form the resist pattern having the desired opening areas. In view of a lift-off method, the resist pattern is formed such that the cross-section of the opening areas tapers from the substrate surface to the upper surface of the resist.

The resist pattern is then subjected to post-baking.

Subsequently, to form electrodes for the surface acoustic wave device, a first layer (about 10 nm) of Ti is formed on the piezoelectric substrate 1 having the above resist pattern. Furthermore, a second layer (about 400 nm) of Al-1 weight percent Cu is formed thereon.

The piezoelectric substrate 1 is then submerged and shaken in a remover to remove the resist pattern and any unnecessary electrode film. Thus, the IDT electrodes 2 and the connecting portions 3 that are electrically connected with the IDT electrodes 2 are formed by the lift-off method. In this preferred embodiment, the line width and the spacing width of the IDT electrodes 2 are about 1 μm. The titanium used as the first layer functions as a contact metal to provide adhesiveness.

Subsequently, the wiring portions 4 are formed. A first layer (about 200 nm) of Ni—Cr, and a second layer (about 800 nm) of Al are formed as the wiring portions 4 by the lift-off method. Since this lift-off method is the same as the above described method, the detailed description thereof is omitted.

The bumps 5 are then formed on the wiring portions 4. The bumps 5 are formed at a location where the films Al—Cu/Ti, which are the IDT electrodes 2 and the connecting portions 3, are not disposed thereunder. Gold bumps or solder bumps are used as the bumps 5.

A wiring portion 4 is formed on a connecting portion 3 including a side of the connecting portion 3, the connecting portion 3 being electrically connected with an IDT electrode 2 and having a rough shape as compared to the shape of the IDT electrode 2. A comb-shaped portion 6 is disposed at an end of the connecting portion 3 on which the wiring portion 4 is formed. In the comb-shaped portion 6 of this preferred embodiment, the line width is about 1 μm, the spacing width is about 1 μm, and the length is about 5 μm. The spacing width of the comb-shaped portion 6 is preferably about 5 μm or less, and is substantially the same as the spacing width in the pattern of the IDT electrode 2. The length of the comb-shaped portion 6 is preferably about 1 to about 10 μm. The comb-shaped portion 6 is preferably formed at the same time as the IDT electrode 2 and the connecting portion 3.

As described above, the surface acoustic wave device 50 is produced.

In general, when a pattern of, for example, an electrode is formed by the lift-off method, as described above, the shape of the resist pattern is formed in view of the lift-off method. In the lift-off method, the resist pattern is formed such that the cross-section of the opening area corresponding to the pattern of, for example, the electrode tapers from the substrate surface to the upper surface of the resist. The formed resist pattern is subjected to thermal shrinkage due to subsequent post-baking.

The IDT electrode portion wherein the resist pattern has a fine shape is not substantially affected by thermal shrinkage. Therefore, the fine resist pattern maintains the above-described taper. On the other hand, the connecting portion in which the shape of the resist pattern is rougher than the shape of the resist pattern in the IDT electrode is substantially affected by thermal shrinkage due to the post-baking. Accordingly, the resist pattern cannot maintain the above-described taper at the opening area corresponding to the rough pattern.

In the lift-off method, the cross-sectional shape of the opening area in the resist pattern significantly affects the shape of the electrode pattern that is formed thereafter. In a resist pattern having a preferable cross-sectional shape at the opening area, the unnecessary electrode films and the resist are removed. Subsequently a desired electrode pattern shape is formed. This is because the above-described taper at the cross-section of the opening area enables the electrode pattern that is formed and the unnecessary electrode films to be discontinuous. In contrast, in the area where the above-described taper cannot be maintained, the electrode pattern that is formed and the unnecessary electrode films are continuous. Therefore, the unnecessary electrode films are torn from the electrode pattern during removal. Consequently, for example, electrode burring is formed in the electrode pattern.

The reason for this is as follows. In a fine resist pattern, since the stress caused by thermal shrinkage is dispersed by the fine pattern, the stress does not substantially change the shape of the pattern. On the other hand, in a rough resist pattern, since the stress caused by thermal shrinkage is not dispersed, the stress substantially changes the shape of the pattern.

When the wiring portion is formed on the connecting portion having the electrode burring, the electrode burring causes problems, such as disconnection at the formed wiring portion.

However, in the above-described preferred embodiment, the comb-shaped portion having the shape similar to that of the IDT electrode is disposed at an end of the connecting portion on which the wiring portion is formed. Accordingly, a resist pattern which maintains the above-described taper is formed without being affected by thermal shrinkage. Consequently, this structure enables the desired IDT electrode and the connecting portion to be formed.

In particular, when a resist pattern for forming an IDT electrode and a connecting portion having a film thickness of at least about 200 nm is formed, the above-described advantage is achieved.

According to the above-described preferred embodiment of the present invention, the comb-shaped portion having a shape similar to that of the IDT electrode is disposed at an end of the connecting portion on which the wiring portion is formed. Therefore, as described above, a resist pattern which maintains the above-described taper is formed without being affected by thermal shrinkage. The shape is not limited to the above-described comb-shape. Alternatively, a fine irregular-shaped portion that has an irregularity of about 5 μm or less may be disposed at an end of the connecting portion. This fine irregular-shaped portion also provides the same advantage.

Figure 3:
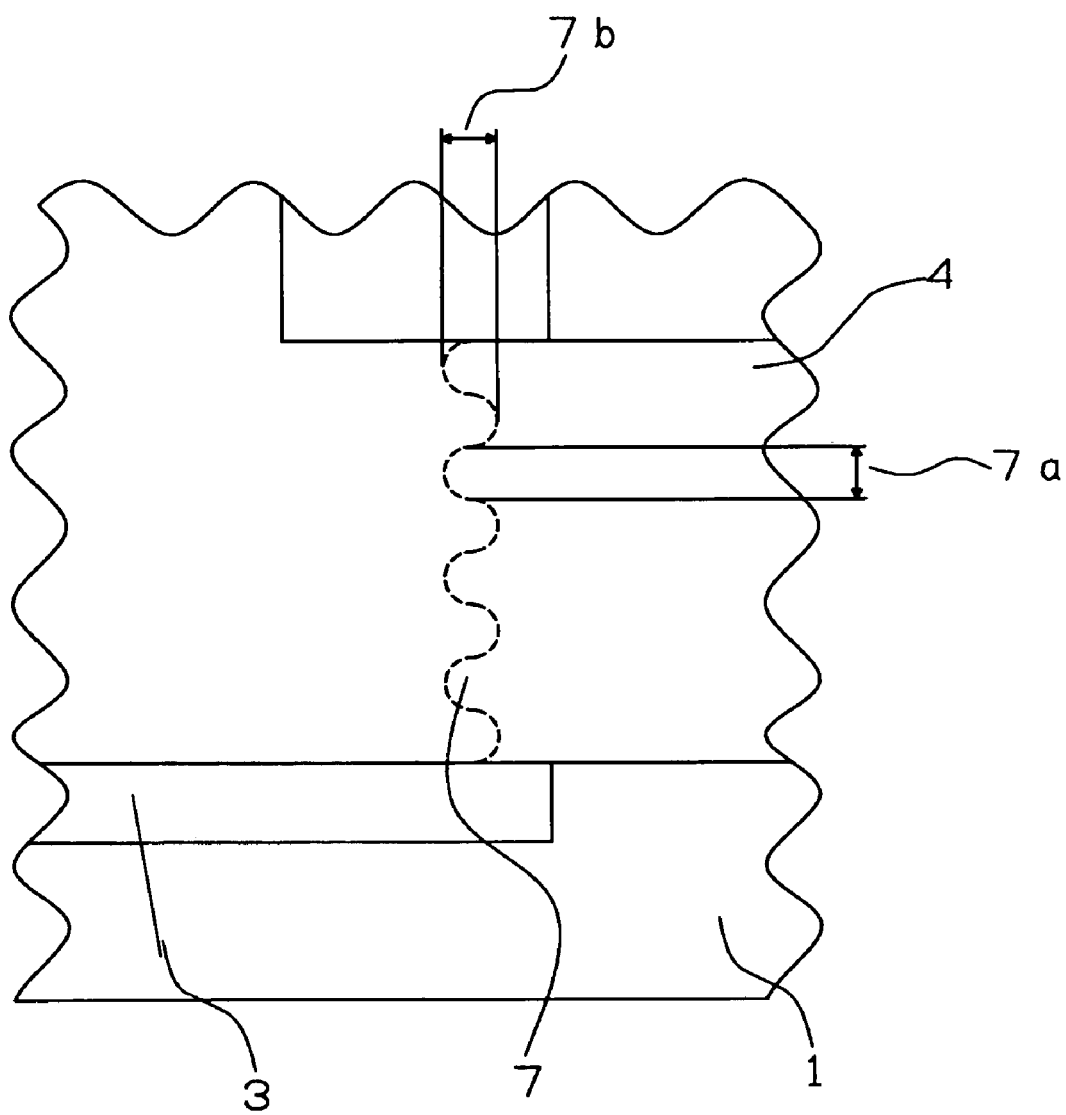
FIG. 3 is a partial enlarged plan view showing an example of a surface acoustic wave device according to another preferred embodiment of the present invention (second preferred embodiment).

In a second preferred embodiment as shown in FIG. 3, a connecting portion 3 is disposed on a piezoelectric substrate 1. A wiring portion 4 is disposed on a portion of the connecting portion 3. The connecting portion 3 includes a fine irregular-shaped portion 7 having a wave shape and disposed at an end of the connecting portion 3 on which the wiring portion 4 is provided. In the fine irregular-shaped portion 7, each of width 7a and height 7b of the irregularity is about 5 μm or less. In a fine resist pattern having a fine irregular-shaped portion 7, since the stress caused by thermal shrinkage is dispersed by the fine pattern, the stress does not substantially change the shape of the pattern.

Accordingly, in such a fine resist pattern, the above-described taper is maintained in the cross-section. The electrode pattern that is formed and the unnecessary electrode films are not continuous, and therefore, the unnecessary electrode films are not torn from the electrode pattern during removal. Consequently, for example, the electrode burring is not formed in the remaining electrode pattern.

The shape of the fine irregular-shaped portion 7 having an irregularity of about 5 μm or less and shown in FIG. 3 may have any shape such as a serration, a semicircle, or a semiellipse as long as the irregularity is about 5 μm or less. These shapes of the fine irregular-shaped portion 7 also provide the same advantage.

It should be understood that the foregoing description is only illustrative of the present invention. Various alternatives and modifications can be devised by those skilled in the art without departing from the present invention. Accordingly, the present invention is intended to embrace all such alternatives, modifications and variations that fall within the scope of the appended claims.

What is claimed is:

1. A surface acoustic wave device comprising:
a piezoelectric substrate;
an interdigital transducer (IDT) electrode disposed on the piezoelectric substrate by a lift-off method;
a connecting portion electrically connected with the IDT electrode; and
a wiring portion disposed on the connecting portion; wherein
the IDT electrode and the connecting portion are formed at the same time; and
a comb-shaped portion is provided at an end of the connecting portion on which the wiring portion is disposed.

2. The surface acoustic wave device according to claim 1, wherein a space between combs of the comb-shaped portion is about 5 μm or less.

3. The surface acoustic wave device according to claim 1, wherein a space between combs of the comb-shaped portion is the same as a spacing width of the IDT electrode.

4. The surface acoustic wave device according to claim 1, wherein the IDT electrode and the connecting portion have a thickness of about 200 nm or more.

5. The surface acoustic wave device according to claim 1, wherein the piezoelectric substrate is a $LiTaO_3$ substrate.

6. The surface acoustic wave device according to claim 1, wherein the IDT electrode includes a Ti layer and a Cu—Al layer disposed on the Ti layer.

7. The surface acoustic wave device according to claim 6, wherein the Ti layer has a thickness of about 10 nm and the Cu—Al layer has a thickness of about 400 nm.

8. A surface acoustic wave device comprising:
a piezoelectric substrate;
an interdigital transducer (IDT) electrode disposed on the piezoelectric substrate by a lift-off method;
a connecting portion electrically connected with the IDT electrode; and a wiring portion disposed on the connecting portion;
wherein
the IDT electrode and the connecting portion are formed at the same time; and
a fine irregular-shaped portion having an irregularity of about 5 μm or less is provided at an end of the connecting portion on which the wiring portion is disposed.

9. The surface acoustic wave device according to claim 8, wherein the IDT electrode and the connecting portion have a thickness of at least about 200 nm.

10. The surface acoustic wave device according to claim 8, wherein the piezoelectric substrate is a LiTaO$_3$ substrate.

11. The surface acoustic wave device according to claim 8, wherein the IDT electrode includes a Ti layer and a Cu—Al layer disposed on the Ti layer.

12. The surface acoustic wave device according to claim 11, wherein the Ti layer has a thickness of about 10 nm and the Cu—Al layer has a thickness of about 400 nm.

13. A method for manufacturing a surface acoustic wave device comprising the steps of:
preparing a piezoelectric substrate;
forming an IDT electrode and a connecting portion that is electrically connected with the IDT electrode on the piezoelectric substrate by a lift-off method; and
forming a wiring portion on the connecting portion; wherein
the step of forming the connecting portion includes a step of forming a comb-shaped portion at an end of the connecting portion on which the wiring portion is formed.

14. The method for manufacturing a surface acoustic wave device according to claim 13, wherein in the step of forming the comb-shaped portion, a space between combs of the comb-shaped portion is about 5 μm or less.

15. The method for manufacturing a surface acoustic wave device according to claim 13, wherein in the step of forming the comb-shaped portion, a space between combs of the comb-shaped portion is the same as a spacing width of the IDT electrode.

16. The method for manufacturing a surface acoustic wave device according to claim 13, wherein the IDT electrode and the connecting portion are formed to have a thickness of about 200 nm or more.

17. The surface acoustic wave device according to claim 13, wherein the IDT electrode is formed to include a Ti layer and a Cu—Al layer disposed on the Ti layer.

18. The surface acoustic wave device according to claim 17, wherein the Ti layer has a thickness of about 10 nm and the Cu—Al layer has a thickness of about 400 nm.

19. A method for manufacturing a surface acoustic wave device comprising the steps of:
preparing a piezoelectric substrate;
forming an IDT electrode and a connecting portion that is electrically connected with the IDT electrode on the piezoelectric substrate by a lift-off method; and
forming a wiring portion on the connecting portion; wherein
the step of forming the connecting portion includes a step of forming a fine irregular-shaped portion having an irregularity of about 5 μm or less at an end of the connecting portion on which the wiring portion is formed.

20. The surface acoustic wave device according to claim 19, wherein the IDT electrode and the connecting portion are formed to have a thickness of at least about 200 nm.

21. The surface acoustic wave device according to claim 19, wherein the IDT electrode is formed to include a Ti layer and a Cu—Al layer disposed on the Ti layer.

22. The surface acoustic wave device according to claim 21, wherein the Ti layer has a thickness of about 10 nm and the Cu—Al layer has a thickness of about 400 nm.

* * * * *